METHOD OF FABRICATING SEMICONDUCTOR DEVICES

Filed June 9, 1966 3 Sheets-Sheet 1

Inventors:
ANGELO D. CHECKI, JR.
BENJAMIN F. GENUALDI &
JAN SACHS
BY M. Y. Epstein
Attorney Inventors:
Angelo D. Checki, Jr.,
Benjamin F. Genualdi &
Jan Sachs
BY M. Y. Epstein
Attorney July 2, 1968 A. D. CHECKI, JR., ET AL 3,390,450

METHOD OF FABRICATING SEMICONDUCTOR DEVICES

Filed June 9, 1966 3 Sheets-Sheet 3

Inventors:
ANGELO D. CHECKI, JR.,
BENJAMIN F. GENUALDI &
JAN SACHS
BY M. Y. Epstein
Attorney

United States Patent Office 3,390,450

Patented July 2, 1968

3,390,450

METHOD OF FABRICATING SEMICONDUCTOR DEVICES

Angelo D. Checki, Jr., Lyndhurst, Benjamin F. Genualdi, Summit, and Jan Sachs, Westwood, N.J., assignors to Radio Corporation of America, a corporation of Delaware Filed June 9, 1966, Ser. No. 556,505
3 Claims. (Cl. 29—589)

This invention relates to a method of fabricating semiconductor devices.

One type of semiconductor device comprises a stem including a header wafer having a pair of leads hermetically sealed therethrough, a metal block or heat sink mounted on the header wafer, a semiconductor pellet mounted on the block, and elongated contacts electrically connecting the leads and preselected portions or bonding pads on the pellet. The ends of the contacts connected to the leads are apertured, and the contacts are press-fitted thereon.

Heretofore, the method of assembly of such semiconductor devices comprised first locating the heat sink on the header wafer of a stem and then immediately bonding the heat sink, by a first brazing or soldering process, to the header wafer. This was done to prevent relative movement between the heat sink and the header wafer during subsequent operations. The next steps comprise locating the pellet in a pre-selected relationship on the heat sink, and assembling the contacts one at a time by press fitting the apertured end of each contact onto a lead, and carefully registering and engaging the other end of the contact with its respective pellet bonding pad. The under surface of the pellet and the surface of the contacts are provided with a coating of solder, whereby, upon heating of the assembly, in a second bonding process, the solder melts to bond the pellet to the heat sink and to bond the contacts to the pellet and to the leads.

The described method requires great care and skill on the part of the assembler, and especially in view of the two bonding steps employed, is time consuming. Further, it is found that the solder coating on the undersurface of the plating generally assumes a convex form. Thus, upon engagement of first one contact and then the other contact with the pellet, the pellet may be caused to rock first one way and then the other, often causing relative movement between the contact ends and the pellet. This, in turn, often results in misregistry between the contact ends and the pellet bonding pads.

An object of this invention is to provide a novel and improved method of fabricating semiconductor devices.

A further object of this invention is to provide a novel method of assembling semiconductor devices which requires little operator skill and only a single bonding operation, and wherein tilting of the pellet during assembly is avoided.

For achieving the above objects, a mounting jig is employed and the semiconductor device parts are assembled into the jig in an order reverse to that used in the aforedescribed method. Certain ones of the parts are maintained in aligned and spaced apart relation prior to the assembly of all of the device parts, and these parts are then moved into engagement with one another in a single operation. The parts are then bonded to one another in a single bonding operation.

The invention is described in connection with the fabrication of a transistor.

Figures 1, 5:
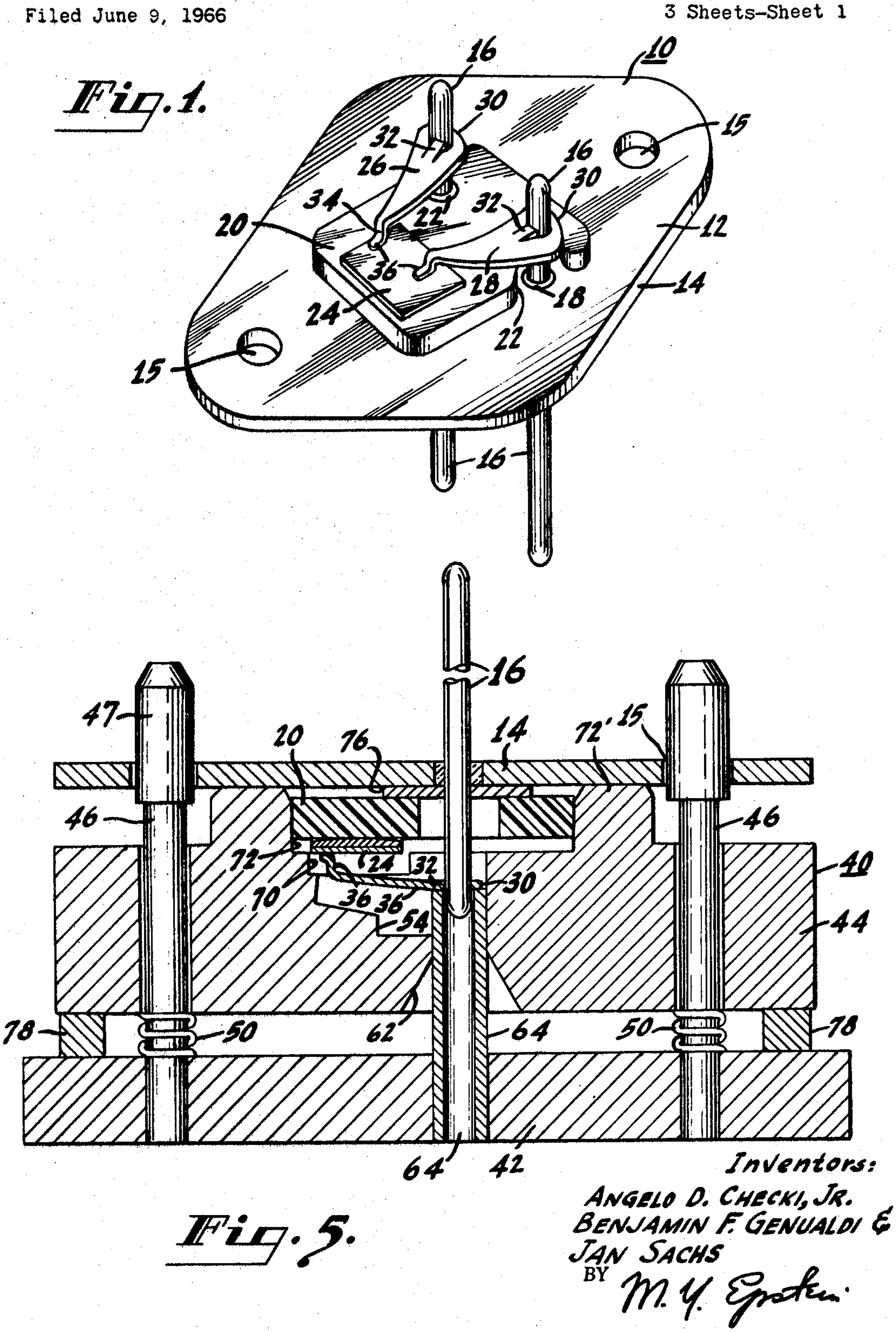
FIG. 1 is a view in perspective of a transistor mount.
FIG. 5 is a view similar to FIG. 4 but at a later step in the fabricating sequence.

With reference to FIG. 1, a transistor mount 10 is shown comprising a stem 12 including a header 14 having two mounting openings 15 therethrough, and two leads 16 hermetically sealed through the header 14 by means of glass seals 18. Mounted on the header 14 is a block or heat sink 20 having two slots 22. Mounted on the heat sink 20 is a semiconductor pellet 24 having regions of P and N type conductivity, and bonding pads electrically connected to the different conductivity regions. Details of the pellet 24 are not shown since such pellets are well known. Two contacts 26 and 28 extend between each lead 16 and a different bonding pad on the pellet 24. The end 30 of each of the contacts 26 and 28 has an aperture 30′ therethrough and an extending tongue 32 locking the contact onto a lead. The end 34 of each of the contacts 26 and 28 has a dependent tongue or tip 36 bonded to a pellet bonding pad.

Although not shown, a complete transistor is provided by hermetically enclosing the mount 10 in a known type enclosure or can.

In this embodiment, the header 14 is made of nickel plated steel, and the heat sink 20, which serves to dissipate heat from the pellet 24, is made of nickel plated copper. The pellet 24 is of silicon, and the contacts 26 and 28 are nickel plated steel.

The mount parts described are bonded to one another by means of solder joints. To this end, prior to assembly of the mount, the bottom surface of the pellet 24 is provided with a coating 25 of solder, and the contacts 26 and 28 are solder clad, as by known means. A 60% tin–40% lead, by weight, solder, for example, can be used.

Figure 2:
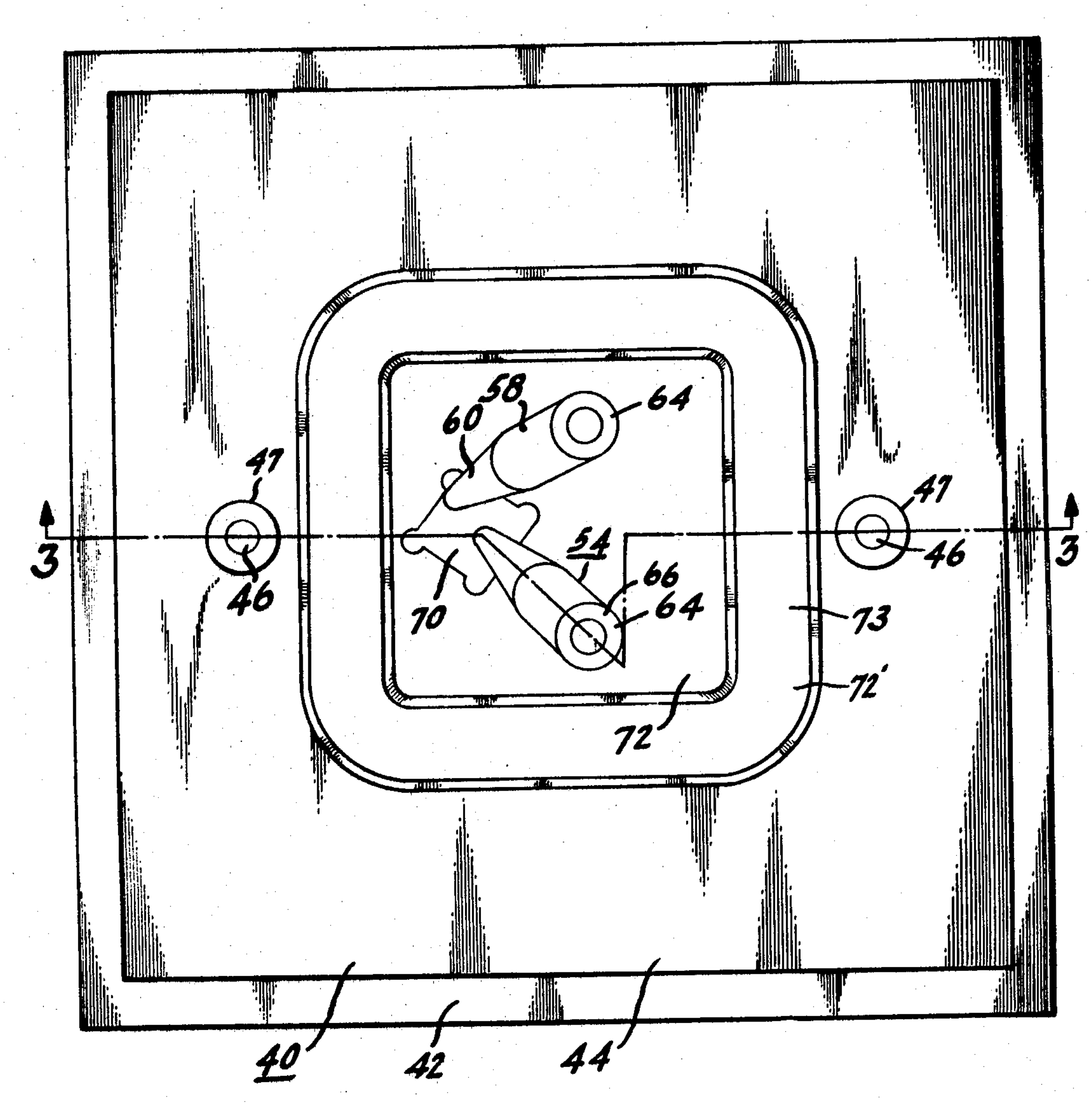
FIG. 2 is a plan view of a jig used in the fabrication of the mount shown in FIG. 1.
Figure 3:
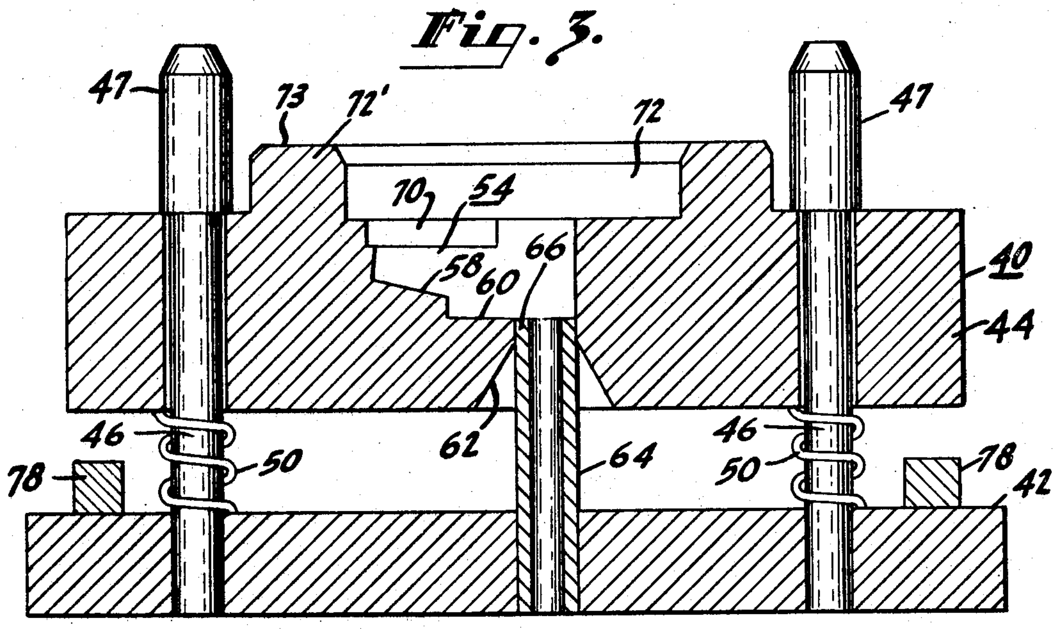
FIG. 3 is a section along line 3—3 of FIG. 2.

In the assembly of the transistor mount 10, a jig 40, as shown in FIGS. 2 and 3, is utilized. The jig 40 comprises a support or base member 42 and a parts-receiving block 44 loosely mounted on a pair of pins 46 mounted on the base 42. Two compression springs 50 are provided around the pins 46 between the block 44 and the base 42, whereby the block 44 is biased in spaced relation above the base 42. The pins 46 are provided with enlarged portions 47 which serve as stops for the block 44.

The block 44 is provided with a number of cavities for receiving the different parts of the transistor mount 10. Two cavities 54 and 56 having inclined and horizontal bottom surfaces 58 and 60, respectively, are provided for receipt of a respective one of the contacts 26 and 28. Two passageways 62 extend through the block 44 from the bottom surfaces 60. Rigidly mounted on the base 42 and extending upwardly through the passageways 62 in sliding fit therein are two tubular members 64, each having a flat upper end 66. In the position of the block 44 shown in FIG. 2, that is, with the block 44 in its upward biased position, the upper ends of the tubular members 64 are flush with the bottom surfaces 60 of the cavities 54 and 56.

A square cavity 70 for receipt of the square pellet 24 is provided in overlapped relation with the adjacent ends of the two cavities 54 and 56. A square cavity 72 is provided for receipt of the heat sink 20. The top surface 73 of the wall 72′ defining the cavity 72 serves as a support for the header wafer 14 of the stem 12.

Figure 4:
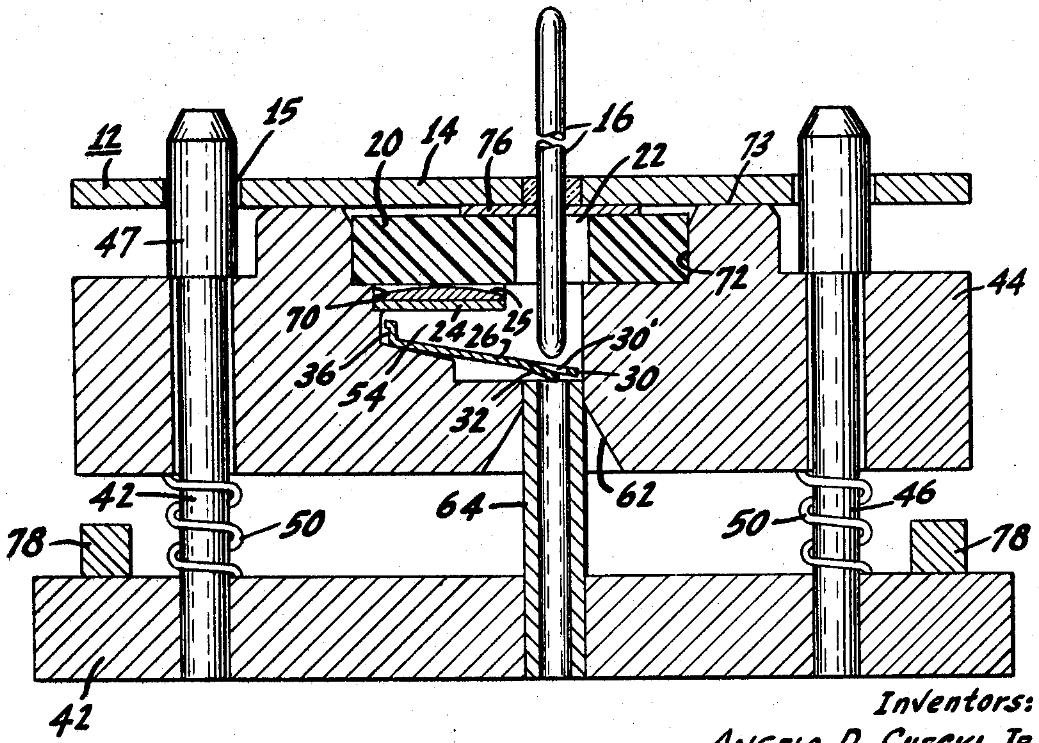
FIG. 4 is a view similar to FIG. 3 but showing transistor mount parts loaded therein.

In the assembly of the transistor mount 10, the two contacts 26 and 28 are first dropped into their respective cavities 54 and 56. As shown in FIG. 4, the contact 26 (as well as contact 28, not shown) assumes an inclined position, with the aperture 30′ through the contact end 30 in alignment with the bore through the tubular member 64, and with the contact tip 36 extending upwardly.

The pellet 24 is then dropped into the cavity 70 and is positioned thereby in proper registry with respect to the tips 36 of the contacts 26 and 28. The pellet 24 is supported by the floor of the cavity 70 in spaced relation with the contacts. This prevents tilting of the pellet 24 due to improper seating of the contacts 26 and 28 in the cavities 54 and 56, or due to dimensional variations of the contacts, or the like.

The heat sink 20 is then placed in the cavity 72 with the slots 22 of the heat sink 20 in alignment with the tubular members 64. The floor of the cavity 72 maintains the heat sink 20 in spaced relation with the solder coated pellet 24 to prevent tilting of either member.

A plate of preform 76 of a solder material is then placed on the heat sink 20.

The stem 12 is then mounted on the jig by aligning the two header openings 15 with the pins 46, thereby aligning the stem leads 16 with the tubular members 64, and threading the header 14 onto the pins 46. The leads 16 are thus inserted into the jig through the slots 22 in the heat sink 20, and into alignment with the apertures 30′ of the contacts 26 and 28. The header 14 is supported by the top surface 73 of the block 44 in spaced relation with the heat sink 20 and the preform thereon to prevent tilting or relative movement of these members. The leads 16 do not engage the contacts 26 and 28 to prevent displacement thereof during the jig loading process.

In another embodiment, not shown, the heat sink 20 is bonded to the stem 12 in a separate operation, and the heat sink 20 and the stem 12 are loaded into the jig 40 as a sub-assembly. In such case, a preform 76 is not loaded into the jig.

In another embodiment, not shown, a heat sink 20 is not used. In such case, the stem 12 is loaded into the jig 40 after the pellet 24, and in spaced relation therewith.

Having assembled the transistor mount parts in properly aligned bust spaced apart relation, a force is applied, e.g. downwardly against the stem 12, as by an assembler or mechanical means, not shown, to move the block 44 downwardly and the mount parts towards one another. The mount parts move downwardly with the block 44 until further movement of the mount parts is prevented by engagement of the parts with one another or with a restraining means. This occurs as follows.

With reference to FIG. 5, downward movement of the ends 30 of the contacts is prevented by engagement of these ends with the fixed tubular members 64. The downwardly moving stem leads 16 are thus force-fitted through the contact apertures 30′ and enter the bores of the tubular members 64. The downwardly moving pellet 24 then engages the tips 36 of the contacts which impede further movement of the pellet 24 and "lift" it out of its cavity 70. The pellet 24, support by the contacts 26 and 28, in turn, is engaged by the downwardly moving heat sink 20 which is likewise "lifted" from its cavity 72. Lastly, the downwardly moving header 14 of the stem 12 engages the preform 76 on the heat sink 20 and presses the heat sink firmly downwardly against the supporting pellet 24 and contacts 26 and 28. The downward pressure exerted against the contacts 26 and 28 causes flexure of the contacts. Stops 78, fixed to the base 42, are provided to limit the downward movement of the block 44. The contact tongues 32 firmly lock the contacts onto the stem leads 16, and the flexed contacts 26 and 28 serve as tensioned springs pressing the mount parts against one another to form a unitary assembly.

In another embodiment, not shown, the stem 12 is restrained from movement, and the tubular members 64 are moved upwardly and inwardly of the block 44. The contacts 26 and 28 are thus raised towards the other mount parts thereby forming a unitary mount assembly.

The thus mechanically secured unitary transistor mount is then removed from the jig and heated to melt the soldering material in the mount to solder the various parts to one another. Although not shown, the transistor is completed by enclosing the mount in a cup-shaped enclosure or can, which, for example, is resistance welded to the header 14.

What is claimed is:

1. A method of assembling a semiconductor mount assembly comprising:
   - first placing an elongated contact having an aperture through one of its ends into a first cavity in a jig,
   - then placing a semiconductor pellet into a second cavity in said jig with a preselected portion of said pellet in spaced alignment with the other end of said contact,
   - then inserting a stem including a header wafer and a lead into said jig with said lead extending into said first cavity in spaced alignment with the aperture of said contact, and with said header wafer in spaced relation with said pellet, and
   - then moving said parts relative to one another for force fitting said contact onto said stem lead and engaging said assembly parts with one another to provide a unitary mount assembly.

2. A method of assembling a semiconductor mount assembly as in claim 1 including the step of restraining movement of either said stem or said contact for force fitting said contact onto said stem lead.

3. A method of assembling a semiconductor mount assembly comprising:
   - first placing two elongated contacts each having an aperture through one of its ends into a respective one of a first pair of cavities in a jig,
   - then placing a semiconductor pellet into a second cavity in said jig with pre-selected portions of said pellet in spaced alignment above the other ends of said contacts,
   - then placing a heat sink in a third cavity in said jig in spaced relation above said pellet,
   - then inserting a stem including a header wafer and a pair of leads into said jig with each of said leads extending into a respective one of said first pair of cavities in space alignment above the aperture of the contact therein, and with said header wafer in spaced relation above said heat sink,
   - then moving said parts in a downward direction while restraining movement of said apertured end of said contacts for force fitting said contacts onto said leads and for sequentially engaging said assembly parts with one another to provide a unitary mount assembly, and
   - then fusion bonding said engaged members to one another.

References Cited

UNITED STATES PATENTS 3,204,327 9/1965 Da Costa ---------- 29—569 X

WILLIAM I. BROOKS, *Primary Examiner.*